(12) United States Patent
Granger-Jones et al.

(10) Patent No.: US 12,212,286 B2
(45) Date of Patent: Jan. 28, 2025

(54) COMPLEMENTARY ENVELOPE DETECTOR

(71) Applicant: Qorvo US, Inc., Greensboro, NC (US)

(72) Inventors: Marcus Granger-Jones, Scotts Valley, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 301 days.

(21) Appl. No.: 17/363,568

(22) Filed: Jun. 30, 2021

(65) Prior Publication Data

US 2022/0286094 A1  Sep. 8, 2022

Related U.S. Application Data

(60) Provisional application No. 63/157,085, filed on Mar. 5, 2021.

(51) Int. Cl.
| H03F 3/45 | (2006.01) |
| H03F 1/02 | (2006.01) |
| H03F 3/24 | (2006.01) |
| H04B 1/40 | (2015.01) |

(52) U.S. Cl.
CPC ........... *H03F 1/0233* (2013.01); *H03F 3/245* (2013.01); *H03F 2200/105* (2013.01); *H03F 2200/451* (2013.01); *H04B 1/40* (2013.01)

(58) Field of Classification Search
CPC .......................................................... H03F 3/45
USPC .................................................. 330/253, 261
See application file for complete search history.

(56) References Cited

U.S. PATENT DOCUMENTS

| 4,646,035 | A | 2/1987 | Chapelle |
| 5,266,936 | A | 11/1993 | Saitoh |
| 5,510,753 | A | 4/1996 | French |
| 5,838,732 | A | 11/1998 | Carney |
| 6,107,862 | A | 8/2000 | Mukainakano et al. |
| 6,141,377 | A | 10/2000 | Sharper et al. |
| 6,141,541 | A | 10/2000 | Midya et al. |
| 6,411,531 | B1 | 6/2002 | Nork et al. |
| 6,985,033 | B1 | 1/2006 | Shirali et al. |
| 7,043,213 | B2 | 5/2006 | Robinson et al. |

(Continued)

FOREIGN PATENT DOCUMENTS

| CN | 103916093 A | 7/2014 |
| CN | 104185953 A | 12/2014 |

(Continued)

OTHER PUBLICATIONS

Quayle Action for U.S. Appl. No. 16/589,940, dated Dec. 4, 2020, 8 pages.

(Continued)

*Primary Examiner* — Henry Choe
(74) *Attorney, Agent, or Firm* — Withrow & Terranova, P.L.L.C.

(57) ABSTRACT

A complementary envelope detector contemplates using two pair of mirrored transistors to provide a differential output envelope signal to an associated envelope tracking integrated circuit (ETIC) that supplies control voltages to an array of power amplifiers. While bipolar junction transistors (BJTs) may be used, other exemplary aspects use field effect transistors (FETs). In an exemplary aspect, a first pair are negative channel FETs (nFETs) and a second pair are positive channel FETs (pFETs).

19 Claims, 9 Drawing Sheets

(56) References Cited

U.S. PATENT DOCUMENTS

| | | | |
|---|---|---|---|
| 7,193,467 B2 * | 3/2007 | Garlepp | H03F 3/45183 |
| | | | 330/253 |
| 7,471,155 B1 | 12/2008 | Levesque | |
| 7,570,931 B2 | 8/2009 | McCallister et al. | |
| 7,994,862 B1 | 8/2011 | Pukhovski | |
| 8,461,928 B2 | 6/2013 | Yahav et al. | |
| 8,493,141 B2 | 7/2013 | Khlat et al. | |
| 8,519,788 B2 | 8/2013 | Khlat | |
| 8,588,713 B2 | 11/2013 | Khlat | |
| 8,718,188 B2 | 5/2014 | Balteanu et al. | |
| 8,723,492 B2 | 5/2014 | Korzeniowski | |
| 8,725,218 B2 | 5/2014 | Brown et al. | |
| 8,774,065 B2 | 7/2014 | Khlat et al. | |
| 8,803,603 B2 | 8/2014 | Wimpenny | |
| 8,818,305 B1 | 8/2014 | Schwent et al. | |
| 8,854,129 B2 | 10/2014 | Wilson | |
| 8,879,665 B2 | 11/2014 | Xia et al. | |
| 8,913,690 B2 | 12/2014 | Onishi | |
| 8,942,651 B2 | 1/2015 | Jones | |
| 8,947,161 B2 | 2/2015 | Khlat et al. | |
| 8,989,682 B2 | 3/2015 | Ripley et al. | |
| 9,018,921 B2 | 4/2015 | Gurlahosur | |
| 9,020,451 B2 | 4/2015 | Khlat | |
| 9,020,453 B2 | 4/2015 | Briffa et al. | |
| 9,041,364 B2 | 5/2015 | Khlat | |
| 9,041,365 B2 | 5/2015 | Kay et al. | |
| 9,055,529 B2 | 6/2015 | Shih | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,538 B2 | 10/2015 | Hong et al. | |
| 9,166,830 B2 | 10/2015 | Camuffo et al. | |
| 9,167,514 B2 | 10/2015 | Dakshinamurthy et al. | |
| 9,172,303 B2 | 10/2015 | Vasadi et al. | |
| 9,197,182 B2 | 11/2015 | Baxter et al. | |
| 9,225,362 B2 | 12/2015 | Drogi et al. | |
| 9,247,496 B2 | 1/2016 | Khlat | |
| 9,263,997 B2 | 2/2016 | Vinayak | |
| 9,270,230 B2 | 2/2016 | Henshaw et al. | |
| 9,270,239 B2 | 2/2016 | Drogi et al. | |
| 9,271,236 B2 | 2/2016 | Drogi | |
| 9,280,163 B2 | 3/2016 | Kay et al. | |
| 9,288,098 B2 | 3/2016 | Yan et al. | |
| 9,298,198 B2 | 3/2016 | Kay et al. | |
| 9,344,304 B1 | 5/2016 | Cohen | |
| 9,356,512 B2 | 5/2016 | Chowdhury et al. | |
| 9,362,868 B2 | 6/2016 | Al-Qaq et al. | |
| 9,377,797 B2 | 6/2016 | Kay et al. | |
| 9,379,667 B2 | 6/2016 | Khlat et al. | |
| 9,445,371 B2 | 9/2016 | Khesbak et al. | |
| 9,491,314 B2 | 11/2016 | Wimpenny | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,869 B2 | 3/2017 | Lerdworatawee | |
| 9,595,981 B2 | 3/2017 | Khlat | |
| 9,596,110 B2 | 3/2017 | Jiang et al. | |
| 9,614,477 B1 | 4/2017 | Rozenblit et al. | |
| 9,634,666 B2 | 4/2017 | Krug | |
| 9,705,451 B2 | 7/2017 | Takenaka et al. | |
| 9,748,845 B1 | 8/2017 | Kotikalapoodi | |
| 9,768,731 B2 | 9/2017 | Perreault et al. | |
| 9,806,676 B2 | 10/2017 | Balteanu et al. | |
| 9,831,834 B2 | 11/2017 | Balteanu et al. | |
| 9,837,962 B2 | 12/2017 | Mathe et al. | |
| 9,900,204 B2 | 2/2018 | Levesque et al. | |
| 9,923,520 B1 | 3/2018 | Abdelfattah et al. | |
| 10,003,416 B1 | 6/2018 | Lloyd | |
| 10,084,376 B2 | 9/2018 | Lofthouse | |
| 10,090,808 B1 | 10/2018 | Henzler et al. | |
| 10,090,809 B1 | 10/2018 | Khlat | |
| 10,097,145 B1 | 10/2018 | Khlat et al. | |
| 10,103,693 B2 | 10/2018 | Zhu et al. | |
| 10,110,169 B2 | 10/2018 | Khesbak et al. | |
| 10,116,470 B2 | 10/2018 | Gu et al. | |
| 10,158,329 B1 | 12/2018 | Khlat | |
| 10,158,330 B1 | 12/2018 | Khlat | |
| 10,170,989 B2 | 1/2019 | Balteanu et al. | |
| 10,291,126 B1 | 5/2019 | Wei et al. | |
| 10,291,181 B2 | 5/2019 | Kim et al. | |
| 10,326,408 B2 | 6/2019 | Khlat et al. | |
| 10,361,744 B2 | 7/2019 | Khlat | |
| 10,381,983 B2 | 8/2019 | Balteanu et al. | |
| 10,382,071 B2 | 8/2019 | Rozek et al. | |
| 10,476,437 B2 | 11/2019 | Nag et al. | |
| 10,622,900 B1 | 4/2020 | Wei et al. | |
| 10,756,675 B2 | 8/2020 | Leipold et al. | |
| 10,862,431 B1 | 12/2020 | Khlat | |
| 10,873,260 B2 | 12/2020 | Yan et al. | |
| 10,879,804 B2 | 12/2020 | Kim et al. | |
| 11,050,433 B1 | 6/2021 | Melanson et al. | |
| 11,121,684 B2 | 9/2021 | Henzler et al. | |
| 11,128,261 B2 | 9/2021 | Ranta et al. | |
| 11,637,531 B1 | 4/2023 | Perreault et al. | |
| 11,848,564 B2 | 12/2023 | Jung et al. | |
| 2002/0021110 A1 | 2/2002 | Nakagawa et al. | |
| 2002/0157069 A1 | 10/2002 | Ogawa et al. | |
| 2002/0167827 A1 | 11/2002 | Umeda et al. | |
| 2003/0107428 A1 | 6/2003 | Khouri et al. | |
| 2004/0201281 A1 | 10/2004 | Ma et al. | |
| 2004/0266366 A1 | 12/2004 | Robinson et al. | |
| 2005/0088160 A1 | 4/2005 | Tanaka et al. | |
| 2005/0090209 A1 | 4/2005 | Behzad | |
| 2005/0227646 A1 | 10/2005 | Yamazaki et al. | |
| 2005/0232385 A1 | 10/2005 | Yoshikawa et al. | |
| 2006/0028271 A1 | 2/2006 | Wilson | |
| 2006/0240786 A1 | 10/2006 | Liu | |
| 2007/0036212 A1 | 2/2007 | Leung et al. | |
| 2007/0052474 A1 | 3/2007 | Saito | |
| 2007/0053217 A1 | 3/2007 | Darroman | |
| 2007/0258602 A1 | 11/2007 | Vepsalainen et al. | |
| 2007/0290748 A1 | 12/2007 | Woo et al. | |
| 2008/0116960 A1 | 5/2008 | Nakamura | |
| 2008/0231115 A1 | 9/2008 | Cho et al. | |
| 2008/0231358 A1 | 9/2008 | Maemura | |
| 2008/0239772 A1 | 10/2008 | Oraw et al. | |
| 2009/0016085 A1 | 1/2009 | Rader et al. | |
| 2009/0045872 A1 | 2/2009 | Kenington | |
| 2009/0191826 A1 | 7/2009 | Takinami et al. | |
| 2010/0019052 A1 | 1/2010 | Yip | |
| 2010/0039321 A1 | 2/2010 | Abraham | |
| 2010/0283534 A1 | 11/2010 | Pierdomenico | |
| 2010/0308919 A1 | 12/2010 | Adamski et al. | |
| 2011/0068757 A1 | 3/2011 | Xu et al. | |
| 2011/0074373 A1 | 3/2011 | Lin | |
| 2011/0136452 A1 | 6/2011 | Pratt et al. | |
| 2011/0148705 A1 * | 6/2011 | Kenington | H01Q 3/28 |
| | | | 342/368 |
| 2011/0175681 A1 | 7/2011 | Inamori et al. | |
| 2011/0199156 A1 | 8/2011 | Hayakawa | |
| 2011/0279179 A1 | 11/2011 | Vice | |
| 2012/0062031 A1 | 3/2012 | Buthker | |
| 2012/0194274 A1 | 8/2012 | Fowers et al. | |
| 2012/0200435 A1 | 8/2012 | Ngo et al. | |
| 2012/0274134 A1 | 11/2012 | Gasparini et al. | |
| 2012/0281597 A1 | 11/2012 | Khlat et al. | |
| 2012/0286576 A1 | 11/2012 | Jing et al. | |
| 2012/0299645 A1 | 11/2012 | Southcombe et al. | |
| 2012/0299647 A1 | 11/2012 | Honjo et al. | |
| 2012/0326691 A1 | 12/2012 | Kuan et al. | |
| 2013/0021827 A1 | 1/2013 | Ye | |
| 2013/0063118 A1 | 3/2013 | Nguyen et al. | |
| 2013/0072139 A1 | 3/2013 | Kang et al. | |
| 2013/0100991 A1 | 4/2013 | Woo | |
| 2013/0127548 A1 | 5/2013 | Popplewell et al. | |
| 2013/0130724 A1 | 5/2013 | Kumar Reddy et al. | |
| 2013/0141064 A1 | 6/2013 | Kay et al. | |
| 2013/0162233 A1 | 6/2013 | Marty | |
| 2013/0176961 A1 | 7/2013 | Kanamarlapudi et al. | |
| 2013/0187711 A1 | 7/2013 | Goedken et al. | |
| 2013/0200865 A1 | 8/2013 | Wimpenny | |
| 2013/0207731 A1 | 8/2013 | Balteanu | |
| 2013/0234513 A1 | 9/2013 | Bayer | |
| 2013/0234692 A1 | 9/2013 | Liang et al. | |

(56) References Cited

U.S. PATENT DOCUMENTS

| | | |
|---|---|---|
| 2013/0271221 A1 | 10/2013 | Levesque et al. |
| 2013/0288612 A1 | 10/2013 | Afsahi et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0097820 A1 | 4/2014 | Miyamae |
| 2014/0103995 A1 | 4/2014 | Langer |
| 2014/0145692 A1 | 5/2014 | Miyamae |
| 2014/0155002 A1 | 6/2014 | Dakshinamurthy et al. |
| 2014/0169427 A1 | 6/2014 | Asenio et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0213196 A1 | 7/2014 | Langer et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0145600 A1 | 5/2015 | Hur et al. |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0302845 A1 | 10/2015 | Nakano et al. |
| 2015/0311791 A1 | 10/2015 | Tseng et al. |
| 2015/0326114 A1 | 11/2015 | Rolland |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1 | 6/2016 | Khlat et al. |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0005676 A1 | 1/2017 | Yan et al. |
| 2017/0006543 A1 | 1/2017 | Khlat |
| 2017/0012675 A1 | 1/2017 | Frederick |
| 2017/0018718 A1 | 1/2017 | Jang et al. |
| 2017/0141736 A1 | 5/2017 | Pratt et al. |
| 2017/0149240 A1 | 5/2017 | Wu et al. |
| 2017/0187187 A1 | 6/2017 | Amin et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0123516 A1 | 5/2018 | Kim et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309409 A1 | 10/2018 | Khlat |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068051 A1 | 2/2019 | Yang et al. |
| 2019/0068234 A1 | 2/2019 | Khlat et al. |
| 2019/0097277 A1 | 3/2019 | Fukae |
| 2019/0103766 A1 | 4/2019 | Von Novak, III et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0199215 A1 | 6/2019 | Zhao et al. |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0288645 A1 | 9/2019 | Nag et al. |
| 2019/0222175 A1 | 10/2019 | Khlat et al. |
| 2019/0319584 A1 | 10/2019 | Khlat et al. |
| 2019/0386565 A1 | 12/2019 | Rosolowski et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0127625 A1 | 4/2020 | Khlat |
| 2020/0127730 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0304020 A1 | 9/2020 | Lu et al. |
| 2020/0313622 A1 | 10/2020 | Eichler et al. |
| 2020/0321848 A1 | 10/2020 | Khlat |
| 2020/0321917 A1 | 10/2020 | Nomiyama et al. |
| 2020/0328677 A1 | 10/2020 | Amin et al. |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0350866 A1 | 11/2020 | Pehlke |
| 2020/0350878 A1 | 11/2020 | Drogi et al. |
| 2020/0382061 A1 | 12/2020 | Khlat |
| 2020/0382066 A1 | 12/2020 | Khlat |
| 2021/0036596 A1 | 2/2021 | Jeon et al. |
| 2021/0036604 A1 | 2/2021 | Khlat et al. |
| 2021/0075372 A1 | 3/2021 | Henzler et al. |
| 2021/0099137 A1 | 4/2021 | Drogi et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194515 A1 | 6/2021 | Go et al. |
| 2021/0194517 A1 | 6/2021 | Mirea et al. |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0257971 A1 | 8/2021 | Kim et al. |
| 2021/0265953 A1 | 8/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |
| 2021/0356299 A1 | 11/2021 | Park |
| 2022/0021348 A1 | 1/2022 | Philpott et al. |
| 2022/0094256 A1 | 3/2022 | Radhakrishnan et al. |

(56) References Cited

U.S. PATENT DOCUMENTS

| | | |
|---|---|---|
| 2022/0103137 A1 | 3/2022 | Khlat et al. |
| 2022/0123698 A1 | 4/2022 | Goto et al. |
| 2022/0181974 A1 | 6/2022 | Liu et al. |
| 2023/0113677 A1 | 4/2023 | Boley et al. |

FOREIGN PATENT DOCUMENTS

| | | |
|---|---|---|
| CN | 104620509 A | 5/2015 |
| CN | 104954301 A | 9/2015 |
| CN | 105322894 A | 2/2016 |
| CN | 105680807 A | 6/2016 |
| CN | 105703716 A | 6/2016 |
| CN | 105721366 A | 6/2016 |
| CN | 106208974 A | 12/2016 |
| CN | 106209270 A | 12/2016 |
| CN | 106877824 A | 6/2017 |
| CN | 107093987 A | 8/2017 |
| CN | 107980205 A | 5/2018 |
| CN | 108141184 A | 6/2018 |
| CN | 109150212 A | 1/2019 |
| EP | 3174199 A2 | 5/2012 |
| EP | 2909928 A1 | 8/2015 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |
| WO | 2022103493 A1 | 5/2022 |

OTHER PUBLICATIONS

Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Notice of Allowance for U.S. Appl. No. 16/582,471, dated Jun. 22, 2021, 9 pages.
Non-Final Office Action for U.S. Appl. No. 16/597,952, dated May 26, 2021, 7 pages.
Notice of Allowance for U.S. Appl. No. 16/834,049, dated Jun. 24, 2021, 8 pages.
Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.

Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, dated Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.
International Search Report and Written Opinion for International Patent Application No. PCT/US2021/052151, dated Jan. 4, 2022, 16 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.

(56) References Cited

OTHER PUBLICATIONS

Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Advisory Action for U.S. Appl. No. 16/807,575, dated Jul. 28, 2022, 3 pages.
Notice of Allowance for U.S. Appl. No. 16/807,575, dated Aug. 19, 2022, 8 pages.
Notice of Allowance for U.S. Appl. No. 17/148,064, dated Aug. 18, 2022, 8 pages.
Non-Final Office Action for U.S. Appl. No. 17/163,642, dated Aug. 17, 2022, 9 pages.
Final Office Action for U.S. Appl. No. 17/032,553, dated Jul. 29, 2022, 6 pages.
Final Office Action for U.S. Appl. No. 17/073,764, dated Jun. 1, 2022, 22 pages.
Advisory Action for U.S. Appl. No. 17/073,764, dated Aug. 23, 2022, 3 pages.
Extended European Search Report for European Patent Application No. 22153526.3, dated Jul. 13, 2022, 9 pages.
International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Non-Final Office Action for U.S. Appl. No. 17/146,765, dated Sep. 7, 2022, 10 pages.
Final Office Action for U.S. Appl. No. 17/163,642, dated Nov. 25, 2022, 13 pages.
Notice of Allowance for U.S. Appl. No. 17/032,553, dated Oct. 11, 2022, 7 pages.
Non-Final Office Action for U.S. Appl. No. 17/073,764, dated Sep. 30, 2022, 13 pages.
Notice of Allowance for U.S. Appl. No. 15/984,566, dated Mar. 18, 2019, 7 pages.
Non-Final Office Action for U.S. Appl. No. 16/263,316, dated Dec. 23, 2019, 10 pages.
Final Office Action for U.S. Appl. No. 16/263,316, dated May 13, 2020, 10 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Final Office Action for U.S. Appl. No. 16/807,575, dated May 4, 2022, 12 pages.
First Office Action for Chinese Patent Application No. 202010083654.0, dated May 12, 2023, 17 pages.
Notification to Grant for Chinese Patent Application No. 202010097807.7, dated Jul. 11, 2023, 14 pages.
International Preliminary Report on Patentability for International Patent Application No. PCT/US2021/050892, dated Oct. 24, 2022, 20 pages.
Advisory Action for U.S. Appl. No. 17/073,764, dated May 26, 2023, 3 pages.
Notice of Allowance for U.S. Appl. No. 15/964,762, dated Mar. 18, 2019, 7 pages.
Written Opinion for International Patent Application No. PCT/US2021/052830, dated Nov. 3, 2022, 7 pages.
Notice of Allowance for U.S. Appl. No. 17/163,642, dated Mar. 1, 2023, 10 pages.
Final Office Action for U.S. Appl. No. 17/073,764, dated Mar. 3, 2023, 14 pages.
International Preliminary Report on Patentability for International Patent Application No. PCT/US2021/052830, dated Feb. 20, 2023, 21 pages.
U.S. Appl. No. 18/039,805, filed Jun. 1, 2023.
U.S. Appl. No. 18/254,155, filed May 23, 2023.
Notice of Allowance for U.S. Appl. No. 17/073,764, dated Aug. 23, 2023, 12 pages.
Decision to Grant for Chinese Patent Application No. 202010083654.0, dated Sep. 11, 2023, 8 pages.
Notification to Grant for Chinese Patent Application No. 202010083654.0, mailed Nov. 9, 2023, 8 pages.
Non-Final Office Action for U.S. Appl. No. 17/343,912, mailed Dec. 14, 2023, 6 pages.
Quayle Action for U.S. Appl. No. 17/351,560, mailed Nov. 24, 2023, 7 pages.
Notice of Allowance for U.S. Appl. No. 17/351,560, mailed Jan. 4, 2024, 7 pages.
Examination Report for European Patent Application No. 21790723.7, mailed Mar. 7, 2024, 5 pages.
Notice of Allowance for U.S. Appl. No. 17/343,912, mailed Mar. 4, 2024, 7 pages.

(56) References Cited

OTHER PUBLICATIONS

Non-Final Office Action for U.S. Appl. No. 17/331,996, mailed Feb. 1, 2024, 9 pages.
Notice of Allowance for U.S. Appl. No. 17/331,996, mailed Mar. 1, 2024, 8 pages.
Intention to Grant for European Patent Application No. 21806074.7, mailed May 10, 2024, 27 pages.
Notice of Allowance for U.S. Appl. No. 17/331,996, mailed Jun. 14, 2024, 9 pages.
Notice of Allowance for U.S. Appl. No. 17/351,560, mailed Apr. 19, 2024, 8 pages.
International Search Report and Written Opinion for International Patent Application No. PCT/US2023/085103, mailed Apr. 26, 2024, 17 pages.
Ma, Hongyan, "Application and implementation of envelope tracking technology in mobile terminal RF power amplifier," Computers and Telecommunicators, Oct. 2017, 18 pages.
First Office Action for Chinese Patent Application No. 201910512645.6, mailed Jul. 3, 2024, 15 pages.
First Office Action for Chinese Patent Application No. 201911232472.9, mailed Jul. 23, 2024, 10 pages.
First Office Action for Chinese Patent Application No. 201911312703.7, mailed Jul. 16, 2024, 10 pages.
Corrected Notice of Allowability for U.S. Appl. No. 17/331,996, mailed Aug. 1, 2024, 6 pages.
Non-Final Office Action for U.S. Appl. No. 17/579,796, mailed Aug. 30, 2024, 6 pages.
First Office Action for Chinese Patent Application No. 201910094452.X, mailed Jul. 31, 2024, 17 pages.
Non-Final Office Action for U.S. Appl. No. 18/254,155, mailed Sep. 4, 2024, 14 pages.
Notice of Allowance for U.S. Appl. No. 18/039,805, mailed Sep. 26, 2024, 10 pages.
Corrected Notice of Allowability and Response to Rule 312 Communication for U.S. Appl. No. 18/039,805, mailed Nov. 21, 2024, 5 pages.

* cited by examiner

COMPLEMENTARY ENVELOPE DETECTOR

RELATED APPLICATIONS

This application claims the benefit of provisional patent application Ser. No. 63/157,085, filed Mar. 5, 2021, the disclosure of which is incorporated herein by reference in its entirety.

FIELD OF THE DISCLOSURE

The technology of the disclosure relates generally to an envelope detector circuit for an envelope tracking (ET) radio frequency (RF) front-end circuit having multiple power amplifiers.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device may be configured to transmit the RF signal(s) simultaneously from multiple antennas using such spatial multiplexing schemes as multiple-input multiple-output (MIMO) and RF beamforming. As such, the 5G-NR mobile communication device needs to employ multiple power amplifiers in an RF front-end module (FEM) to amplify the RF signal(s) before feeding to the multiple antennas.

Envelope tracking (ET) is a power management technique designed to improve operating efficiency of the power amplifiers. Specifically, the power amplifiers simultaneously amplify the RF signal(s) based on multiple ET voltages that track a time-variant power envelope of the RF signal(s). Understandably, the better the ET voltages can track the time-variant power envelope, the more efficient the power amplifier can operate. While improvements have been made in ET integrated circuits that control the power amplifiers, there remains a need to improve envelope tracking.

SUMMARY

Embodiments of the disclosure relate to a complementary envelope detector. Specifically, exemplary aspects contemplate using two pair of mirrored transistors to provide a differential output envelope signal to an associated envelope tracking integrated circuit (ETIC) that supplies control voltages to an array of power amplifiers. While bipolar junction transistors (BJTs) may be used, other exemplary aspects use field effect transistors (FETs). In an exemplary aspect, a first pair are negative channel FETs (nFETs) and a second pair are positive channel FETs (pFETs). The sets of paired transistors provide a low time delay that is relatively invariant with changes to input power or frequency, provides low carrier leakage and effectively filters out second order harmonics while at the same time providing a differential output envelope signal.

In one aspect, an envelope detector circuit is disclosed. The envelope detector circuit includes an input comprising a positive input line and a negative input line. The envelope detector circuit includes a first transistor pair. The first transistor pair includes a first transistor coupled to the positive input line. The first transistor pair further includes a second transistor coupled to the negative input line a first pair output. The envelope detector circuit includes a second transistor pair. The second transistor pair includes a third transistor coupled to the positive input line. The second transistor pair further includes a fourth transistor coupled to the negative input line and a second pair output. The envelope detector circuit includes an output. The output includes a positive output line coupled to the first pair output and a negative output line coupled to the first pair output and the second pair output.

In another aspect, a wireless device is disclosed. The wireless device includes envelope detector circuit includes an input comprising a positive input line and a negative input line. The envelope detector circuit includes a first transistor pair. The first transistor pair includes a first transistor coupled to the positive input line. The first transistor pair further includes a second transistor coupled to the negative input line a first pair output. The envelope detector circuit includes a second transistor pair. The second transistor pair includes a third transistor coupled to the positive input line. The second transistor pair further includes a fourth transistor coupled to the negative input line and a second pair output. The envelope detector circuit includes an output. The output includes a positive output line coupled to the first pair output and a negative output line coupled to the first pair output and the second pair output. The wireless device further includes envelope tracking (ET) radio frequency (RF) front-end circuits. The wireless device further includes an ET integrated circuit (ETIC) coupled to the output, the ETIC configured to generate at least one control voltage based on a signal from the envelope detector circuit and a plurality of power amplifiers coupled to a plurality of antenna ports, respectively, at least one of the plurality of power amplifiers coupled to the ETIC and configured to receive the at least one control voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
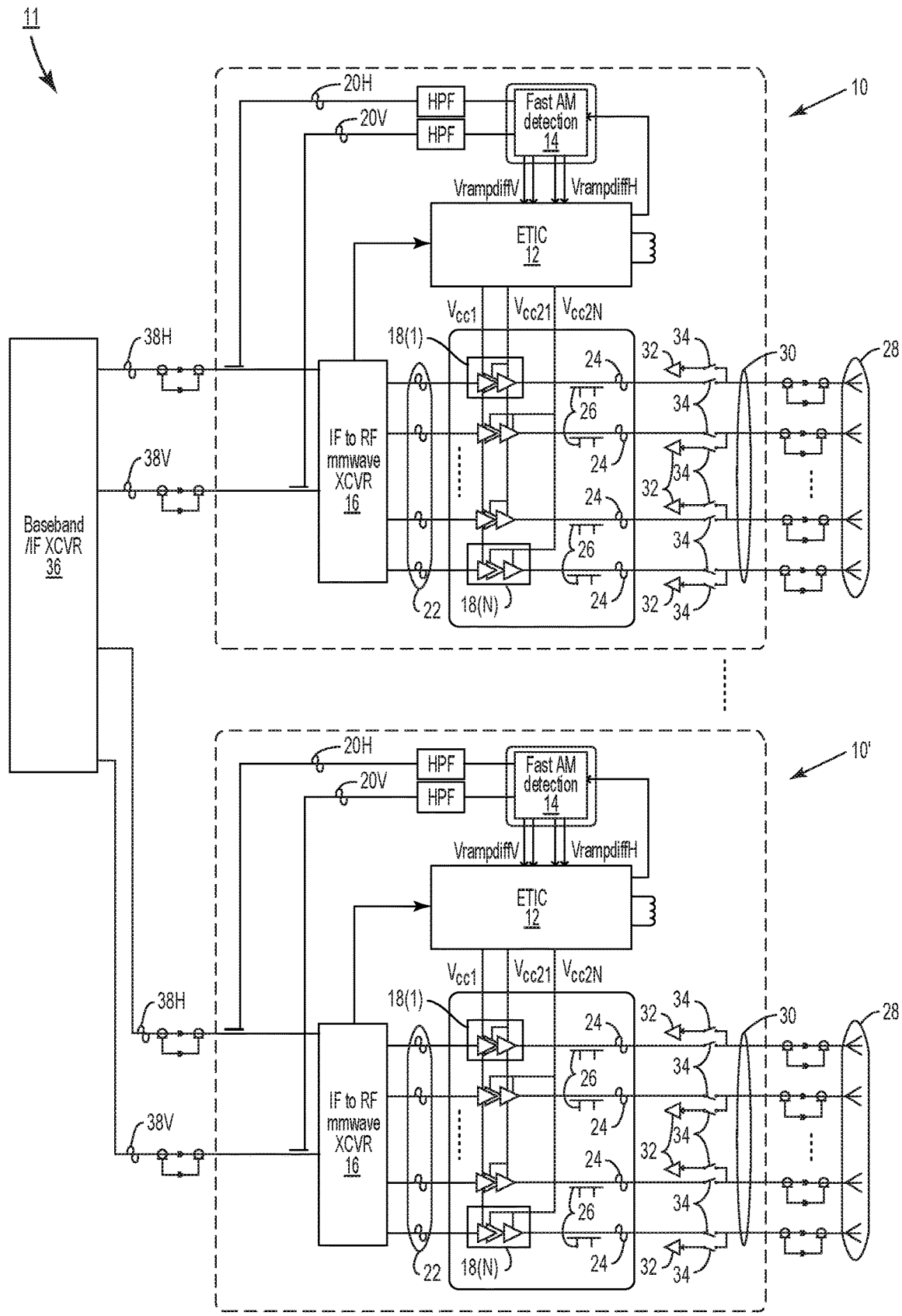
FIG. 1A is a schematic diagram of exemplary envelope tracking (ET) radio frequency (RF) front-end circuits coupled to a baseband transceiver circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a complementary envelope detector. Specifically, exemplary aspects contemplate using two pair of mirrored transistors to provide a differential output envelope signal to an associated envelope tracking (ET) integrated circuit (ETIC) that supplies control voltages to an array of power amplifiers. While bipolar junction transistors (BJTs) may be used, other exemplary aspects use field effect transistors (FETs). In an exemplary aspect, a first pair are negative channel FETs (nFETs) and a second pair are positive channel FETs (pFETs). The sets of paired transistors provide a low time delay that is relatively invariant with changes to input power or frequency, provides low carrier leakage and effectively filters out second order harmonics while at the same time providing a differential output envelope signal.

Figure 1B:
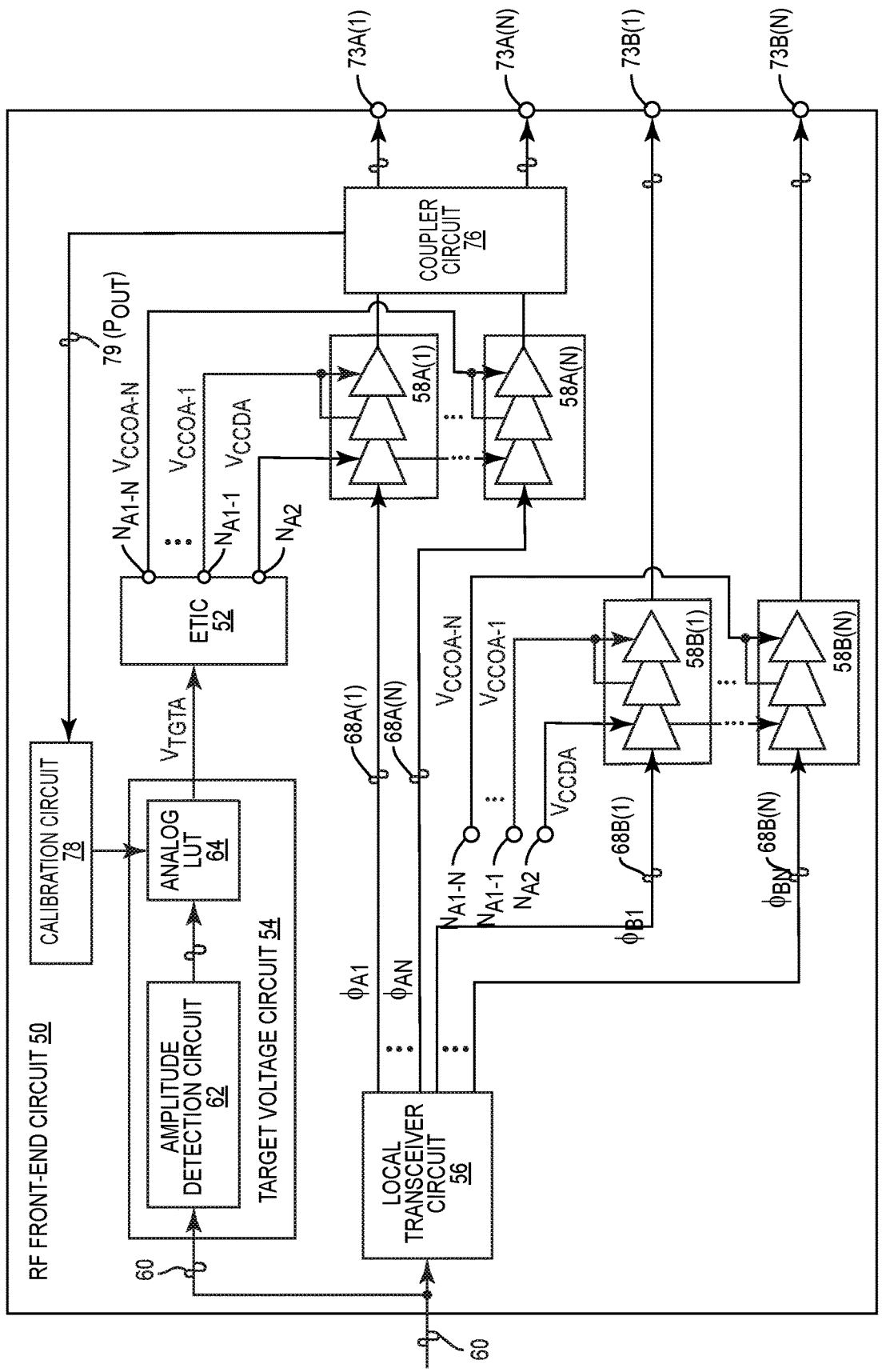
FIG. 1B is a schematic diagram of an alternate exemplary envelope tracking ET RF front-end circuits coupled to a baseband transceiver circuit.
Figure 1C:
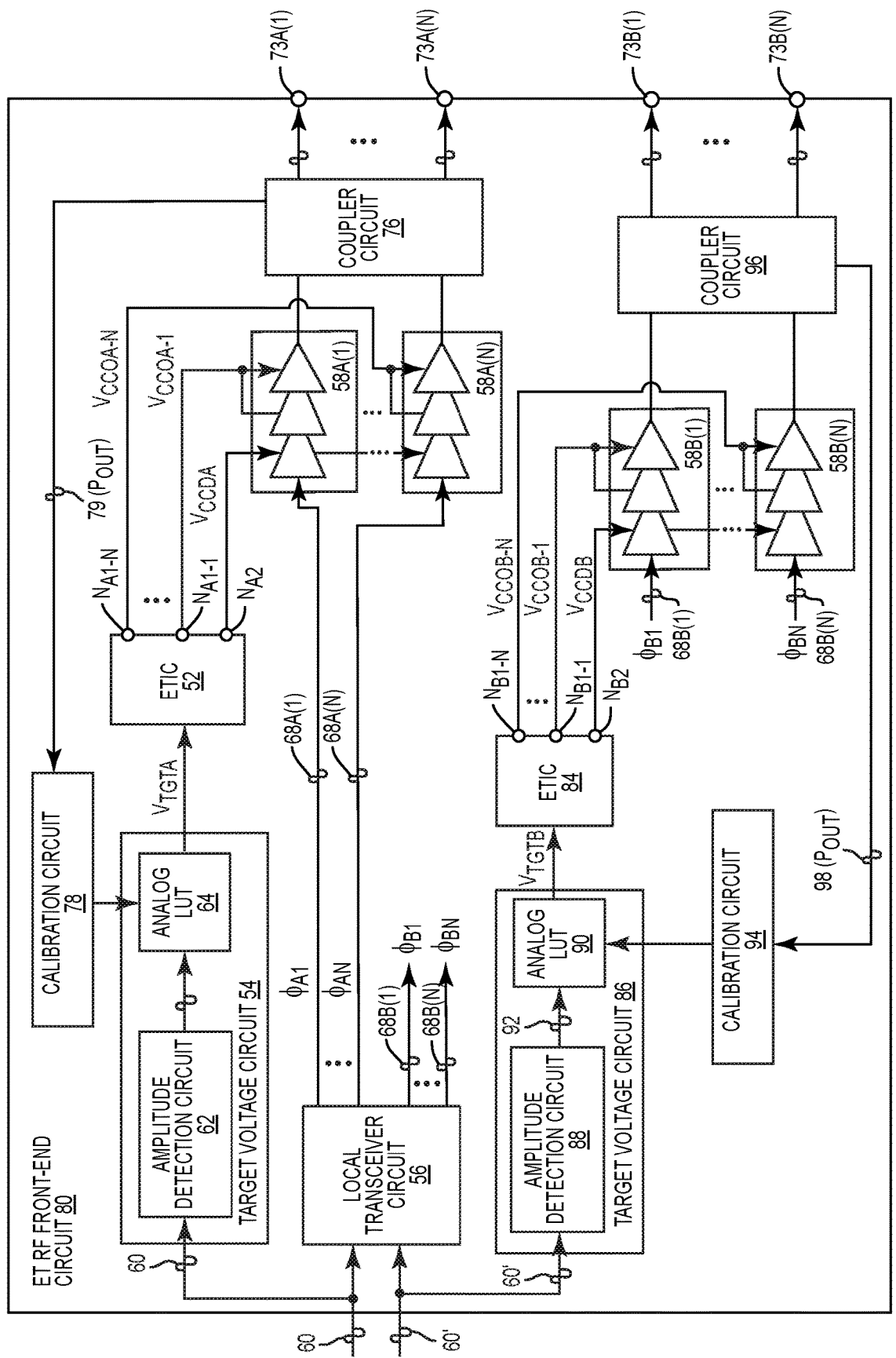
FIG. 1C is a schematic diagram of another alternate exemplary ET RF front-end circuits coupled to a baseband transceiver circuit.
Figure 2:
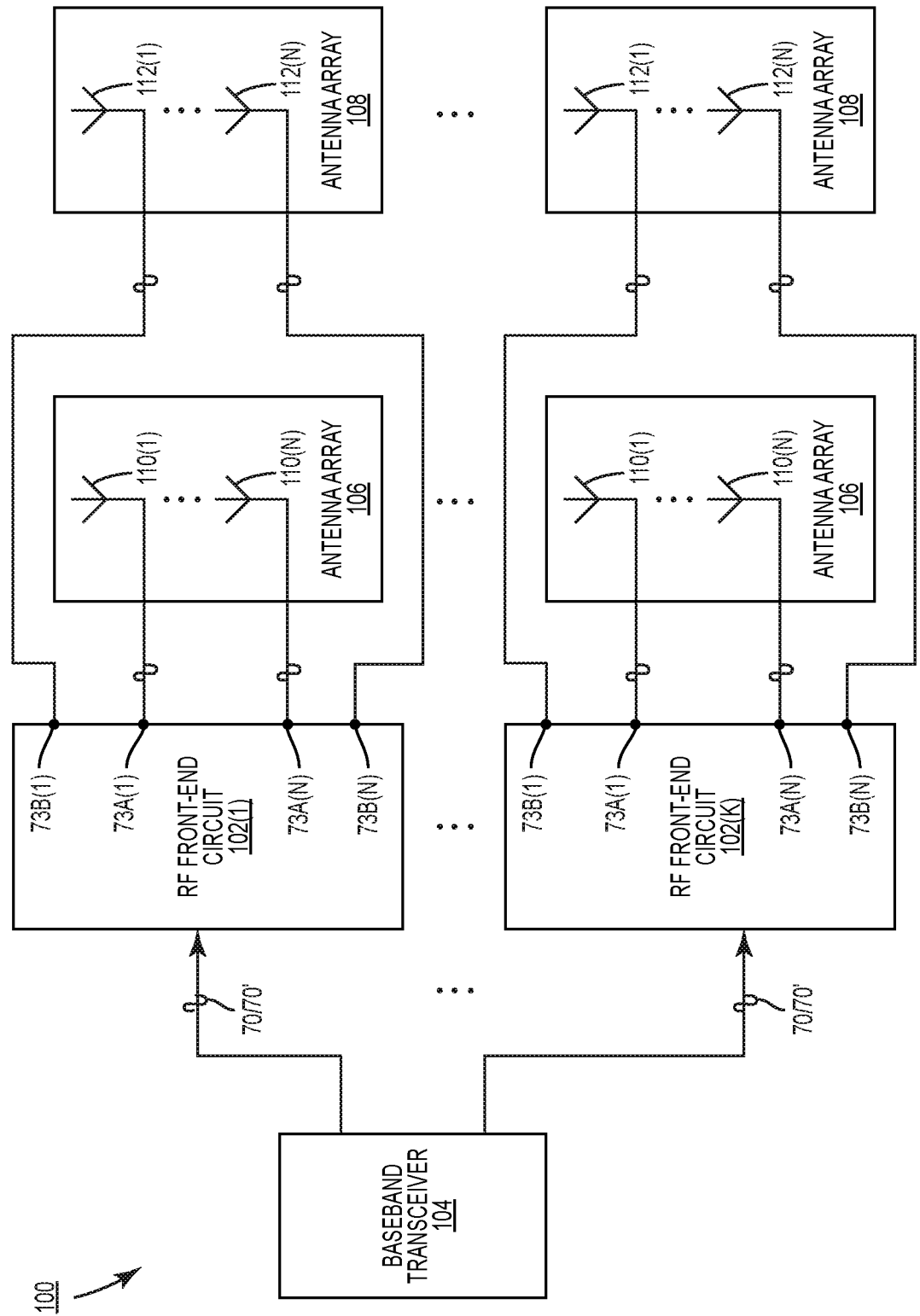
FIG. 2 is a schematic diagram of a wireless device including a number of the ET RF front-end circuits of FIGS. 1A-1C.

Before addressing particular aspects of the present disclosure, a brief discussion of the context is provided. Specifically, FIGS. 1A-1C illustrate various radio frequency (RF) front end circuits which may use envelope detectors and FIG. 2 illustrates a wireless device which may include an RF front end circuit. Discussion of exemplary aspects of the present disclosure begins below with reference to FIG. 3.

In this regard, FIG. 1A is a schematic diagram of an exemplary ET RF front end circuit 10 that may be contained within a device 11. The ET RF front end circuit 10 may be self-contained in a system-on-chip (SoC) or system-in-package (SiP), as an example, to provide all essential functions of an RF front end module (FEM). The ET RF front end circuit 10 may include an ETIC 12, a target voltage circuit 14 (also referred to as a fast amplitude modulation (AM) detection circuit or an envelope detector circuit), a local transceiver circuit 16, and a number of power amplifiers 18(1)-18(N). By packaging the ETIC 12, the target voltage circuit 14, the local transceiver circuit 16, and the power amplifiers 18(1)-18(N) into the ET RF front-end circuit 10, it is possible to reduce distance-related distortion, thus helping to improve operating efficiency and linearity of the power amplifiers 18(1)-18(N).

The ETIC 12 is configured to generate a first ET voltage $V_{CC}$ at a first output node. The ETIC 12 is also configured to generate second ET voltages at a second output node. The ETIC 12 generates both the first ET voltage $V_{CC1}$ and the second ET voltages $V_{CC21}$-$V_{CC2N}$ (the second ET voltages) based on a time-variant ET signals VrampdiffV and VrampdiffH (sometimes referred to as a target voltage $V_{TGTA}$). For a detailed description on specific embodiments of the ETIC 12 that generate the first ET voltages based on the time-variant ET target voltage $V_{TGTA}$, please refer to U.S. Pat. No. 11,677,365, entitled "ENVELOPE TRACKING POWER MANAGEMENT APPARATUS INCORPORATING MULTIPLE POWER AMPLIFIERS."

The target voltage circuit 14 is configured to generate the time-variant ET signals based on input signals 20H, 20V, each of which can be a modulated carrier signal at an intermediate frequency (IF) and each signal 20H, 20V may be a differential signal as well. In a non-limiting example, the target voltage circuit 14 may include an amplitude detection circuit and an analog lookup table (LUT) (neither shown). The amplitude detection circuit 14 is configured to detect a number of time-variant amplitudes of the input signals 20H, 20V and the analog LUT is configured to generate the time-variant ET signals based on the time-variant amplitudes.

The local transceiver 16 provides signals 22 to the amplifiers 18(1)-18(N) for amplification to amplified signals 24. The amplified signals 24 may be detected by couplers 26 to provide an indication to the ETIC 12 of whether the target voltages are being met so adjustments may be made as is well understood. The amplified signals 24 are further provided to antennas 28 for transmission. A flexible conductor(s) 30 may couple the RF front end circuit 10 to the antennas 28. Grounding terminations 32 may be used with switches 34 for selective impedance matching.

The device 11 may further include a RF front end circuit 10', which is substantially similar to the RF front end circuit 10, so a duplicative discussion is omitted. The device 11 may also include a baseband transceiver circuit 36 that upconverts a baseband signal to an IF input signal 38H, 38V.

Similarly, FIG. 1B is a schematic diagram of an exemplary ET RF front-end circuit 50 configured according to an embodiment of the present disclosure. In embodiments disclosed herein, the ET RF front-end circuit 50 is self-contained in a system-on-chip (SoC) or system-in-package (SiP), as an example, to provide all essential functions of an RF front-end module (FEM). Specifically, the ET RF front-end circuit 50 is configured to include an ETIC 52, a target voltage circuit 54, a local transceiver circuit 56, and a number of power amplifiers 58A(1)-58A(N). The ET RF front-end circuit 50 may also include a number of second power amplifiers 58B(1)-58B(N). By packaging the ETIC 52, the target voltage circuit 54, the local transceiver circuit 56, the power amplifiers 58A(1)-58A(N), and the second power amplifiers 58B(1)-58B(N) into the ET RF front-end circuit 50, it is possible to reduce distance-related distortion in the aforementioned conventional implementation, thus helping to improve operating efficiency and linearity of the power amplifiers 58(1)-58(N).

The ETIC 52 is configured to generate a number of first ET voltages $V_{CCOA-1}$-$V_{CCOA-N}$ at a number of first output nodes $N_{A1-1}$-$N_{A1-N}$, respectively. The ETIC 52 is also configured to generate a second ET voltage $V_{CCDA}$ at a second output node $N_{A2}$. The ETIC 52 generates both the first ET voltages $V_{CCOA-1}$-$V_{CCOA-N}$ and the second ET voltage $V_{CCDA}$ based on a time-variant ET target voltage $V_{TGTA}$. For a detailed description on specific embodiments of the ETIC 52 that generate the first ET voltages $V_{CCOA-1}$-$V_{CCOA-N}$ and the second ET voltage $V_{CCDA}$ based on the time-variant ET target voltage $V_{TGTA}$, please refer to the previously mentioned '507 application.

The target voltage circuit 54 is configured to generate the time-variant ET target voltage $V_{TGTA}$ based on an input signal 60, which can be a modulated carrier signal at millimeter wave (mmWave) frequency, intermediate frequency (IF), or In-phase/Quadrature (I/Q) baseband frequency. In a non-limiting example, the target voltage circuit 54 includes an amplitude detection circuit 62 and an analog lookup table (LUT) 64. The amplitude detection circuit 62 is configured to detect a number of time-variant amplitudes of the input signal 60 and the analog LUT 64 is configured to generate the time-variant ET target voltage $V_{TGTA}$ based on the time-variant amplitudes.

It should be appreciated that the local transceiver circuit 56 may be coupled to a baseband transceiver circuit 36 (FIG. 1A), which is separated from the ET RF front-end circuit 50 by a conductive distance that can stretch to several centimeters. The baseband transceiver circuit may provide the input signal 60 to the local transceiver circuit 56 in IF to help reduce distortion over the conductive distance. In this regard, in a non-limiting example, the baseband transceiver circuit can upconvert the input signal 60 from baseband frequency to the IF. The local transceiver circuit 56 is configured to generate a number of RF signals 68A(1)-68A(N) and a number of second RF signals 68B(1)-68B(N) in an RF frequency (a.k.a. carrier frequency) higher than the IF based on the input signal 60.

Each of the power amplifiers 58A(1)-58A(N) is coupled to a respective one a number of antenna ports 73A(1)-73A(N) and configured to amplify a respective one of the RF signals 68A(1)-68A(N) based on a respective one of the first ET voltages $V_{CCOA-1}$-$V_{CCOA-N}$ as well as the second ET voltage $V_{CCDA}$. Each of the second power amplifiers 58B(1)-58B(N) is coupled to a respective one a number of second antenna ports 73B(1)-73B(N) and configured to amplify a respective one of the second RF signals 68B(1)-68B(N) based on a respective one of the first ET voltages $V_{CCOA-1}$-$V_{CCOA-N}$ as well as the second ET voltage $V_{CCDA}$.

The ET RF front-end circuit 50 may include a calibration circuit 78 and a coupling or coupler circuit 76. The coupler circuit 76 may be provided between the power amplifiers 58A(1)-58A(N) and the antenna ports 73A(1)-73A(N). The coupling circuit 76 may be configured to provide a feedback signal 79 indicating an output power $P_{OUT}$ of any of the power amplifiers 58A(1)-58A(N). Accordingly, the calibration circuit 78 may be configured to calibrate the analog LUT 64 based on the feedback signal 79. For a detailed description on specific embodiments of the calibration circuit 78, please refer to U.S. Pat. No. 11,545,945, entitled "APPARATUS AND METHOD FOR CALIBRATING AN ENVELOPE TRACKING LOOKUP TABLE."

FIG. 1C is a schematic diagram of an exemplary ET RF front-end circuit 80 configured according to another embodiment of the present disclosure. Common elements between FIGS. 1B and 1C are shown therein with common element numbers and will not be re-described herein.

Herein, the local transceiver circuit 56 also receives a second input signal 60' that is different from the input signal 60. Similar to the input signal 60, the second input signal 60' may be generated in the IF by the same baseband transceiver that generates the input signal 60. Accordingly, the local transceiver circuit 56 generates the second RF signals 68B(1)-68B(N) based on the second input signal 60'.

The ET RF front-end circuit 80 may include a second ETIC 84 and a second target voltage circuit 86. The second ETIC 84 is configured to generate a plurality of third ET voltages $V_{CCOB-1}$-$V_{CCOB-N}$ at a number of third output nodes $N_{B1-1}$-$N_{B1-N}$, respectively. The second ETIC 84 is also configured to generate a fourth ET voltage $V_{CCDB}$ at a fourth output node $N_{B2}$. The second ETIC 84 may generate the third output nodes $N_{B1-1}$-$N_{B1-N}$ and the fourth output node $N_{B2}$ based on a second time-variant ET target voltage $V_{TGTB}$.

The second target voltage circuit 86 is configured to generate the second time-variant ET target voltage $V_{TGTB}$ based on the second input signal 70'. The second target voltage circuit 86 may include a second amplitude detection circuit 88 and a second analog LUT 90. The second amplitude detection circuit 88 is configured to detect a plurality of second time-variant amplitudes of the second input signal 82. The second analog LUT 90 is configured to generate the second time-variant ET target voltage $V_{TGTB}$ based on the second time-variant amplitudes.

The ET RF front-end circuit 80 may also include a second calibration circuit 94 and a second coupling or coupler circuit 96. The second coupler circuit 96 may be coupled between the second power amplifiers 58B(1)-58B(N) and the second antenna ports 73B(1)-73B(N). The second coupling circuit 96 is configured to provide a second feedback signal 98 indicating an output power $P_{OUT}$ of any of the second power amplifiers 58B(1)-58B(N). Accordingly, the second calibration circuit 94 can calibrate the second analog LUT 90 based on the second feedback signal 98.

One or more of the ET RF front-end circuits of FIG. 1A-1C can be provided in a wireless device (e.g., a smartphone) to help enhance RF performance and user experience. In this regard, FIG. 2 is a schematic diagram of a wireless device 100 that includes a number of ET RF front-end circuits 102(1)-102(K).

The wireless device 100 includes a baseband transceiver 104 that is separated from any of the ET RF front-end circuits 102(1)-102(K). The baseband transceiver 104 is configured the generate the input signal 70 and the second input signal 70'.

Each of the ET RF front-end circuits 102(1)-102(K) is coupled to a first antenna array 106 and a second antenna array 108. The first antenna array 106 includes a number of first antennas 110(1)-110(N), each coupled to a respective one of the antenna ports 73A(1)-73A(N) and configured to radiate a respective one of the RF signals in a first polarization (e.g., horizontal polarization). The second antenna array 108 includes a number of second antennas 112(1)-112(N), each coupled to a respective one of the second antenna ports 73B(1)-73B(N) and configured to radiate a respective one of the second RF signals in a second polarization (e.g., vertical polarization).

The ET RF front-end circuits 102(1)-102(K) may be disposed in different locations in the wireless device 100 to help enhance RF performance and improve user experience. For example, some of the ET RF front-end circuits 102(1)-102(K) may be provided on a top edge of the wireless device 100, while some of the ET RF front-end circuits 102(1)-102(K) are provided on a bottom edge of the wireless device 100.

It should be appreciated that the delay a signal such as signal 38H, 38V, 70, 70' or the like experiences along the path to the power amplifiers should be relatively short but should be longer than the delay required to form the control signals for the power amplifiers through envelope detection and the ETIC. This timing relation suggests that the delay experienced in the envelope detection and ETIC be relatively short. As more processing is generally required in the ETIC, the delays in the envelope detection circuit should be relatively minimal, for example, less than 0.4 nanoseconds. Furthermore, this time delay in the envelope detection circuit should not vary significantly with input power. Further concerns about the envelope detection circuit include a desire to have low carrier leakage to prevent unnecessary power consumption and/or heat generation. Within these time and power constraints, the more the envelope detection circuit can do to take burdens off the ETIC, the more time and power budget may be preserved for the ETIC to create desired $V_{CC}$ supply voltages to control the power amplifiers. Thus, it may also be desirable for the envelope detection circuit to handle filtering out harmonics while having a minimum bandwidth detection of zero to two hundred megahertz (i.e., direct current (DC) to 200 MHz). Further, the envelope detection circuit should be able to drive the capacitive load found in the ETIC while having a low memory (i.e., the output signal should not be based on what has happened earlier but should be based just on the current input signal). If the input signal is in the IF, then the envelope detection circuit should be able to operate in the IF. There are also advantages to having a differential input signal. Finding an envelope detection circuit that does all of these things has proven challenging for the industry. However, exemplary aspects of the present disclosure provide a number of complementary envelope detection circuits that manage to strike a balance that meets these demands.

Figure 3:
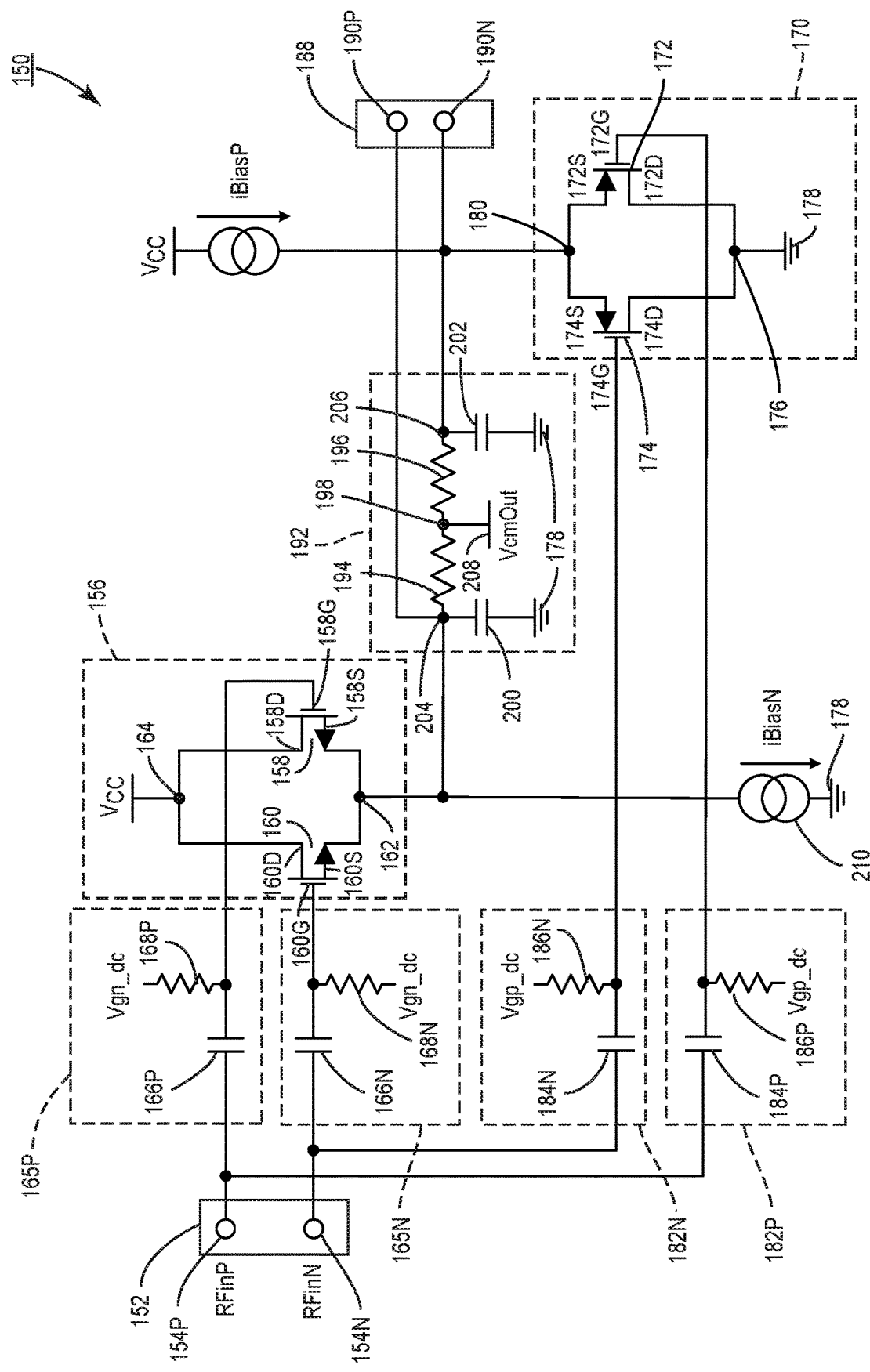
FIG. 3 is a circuit diagram of a first exemplary envelope detection circuit according to the present disclosure.

In this regard, FIG. 3 illustrates a first envelope detector circuit 150. The envelope detector circuit 150 is a differential circuit that includes an input 152 that receives a positive signal (e.g., RFinP) at or on a positive input line 154P and receives a negative signal (e.g., RFinN) at or on a negative input line 154N. The envelope detector circuit 150 may further include a first transistor pair 156 that includes a first transistor 158 coupled to the positive input line 154P and a second transistor 160 coupled to the negative input line 154N.

In this exemplary aspect, the first and second transistors 158, 160 may be FETs, and in particular are n-channel FETs (nFETs). The first transistor pair 156 may further include a first pair output 162 that couples to the sources 158S, 160S of the respective transistors 158, 160. The first transistor pair 156 also includes a supply voltage input 164 coupled to the drains 158D, 160D of the respective first and second transistors 158, 160. The supply voltage input 164 may receive a supply voltage signal $V_{CC}$.

The positive input inline 154P may be coupled to the gate 158G of the first transistor 158. Similarly, the negative input line 154N may be coupled to the gate 160G of the second transistor 160. The positive input line 154P may further include a positive filter 165P formed from positive line capacitor 166P and a positive line resistor 168P between the input 152 and the gate 158G. Similarly, the negative input line 154N may include a negative filter 165N having a negative line capacitor 166N and a negative line resistor 168N between the input 152 and the gate 160G.

The envelope detector circuit 150 further includes a second transistor pair 170 that includes a third transistor 172 coupled to the positive input line 154P and a fourth transistor 174 coupled to the negative input line 154N. In this exemplary aspect, the third and fourth transistors 172, 174 may be FETs, and, in particular, are p-channel FETs (pFETs). The second transistor pair 170 may further include a second pair ground 176 that couples to the drains 172D, 174D of the respective transistors 172, 174 to a ground 178. The second transistor pair 170 may also include a second pair output 180 coupled to the sources 172S, 174S of the respective transistors 172, 174. The second pair output 180 may receive a supply current signal iBiasP.

The positive input inline 154P may be coupled to the gate 172G of the third transistor 172. Similarly, the negative input line 154N may be coupled to the gate 174G of the fourth transistor 174. The positive input line 154P may further include a positive filter 182P formed from positive line capacitor 184P and a positive line resistor 186P between the input 152 and the gate 172G. Similarly, the negative input line 154N may include negative filter 182N having a negative line capacitor 184N and a negative line resistor 186N between the input 152 and the gate 174G.

The envelope detector circuit 150 may further include an output 188 that includes a positive output line 190P and a negative output line 190N. The positive output line 190P is coupled to the first pair output 162. The negative output line 190N is coupled to the second pair output 180. The negative output line 190N is also coupled to the first pair output 162 through a filter 192. The filter 192 includes at least one resistor and one capacitor and more specifically may include two resistors 194, 196 with a node 198 therebetween. Capacitors 200, 202 couple to ground 178 from nodes 204, 206 respectively. Node 198 may provide an output VcmOut 208.

It should be appreciated that the node 204 is essentially also the first pair output 162 and also coupled to the positive output line 190P. The negative output line 190N is also coupled to the supply current signal iBiasP at node 206. Likewise, the node 204 is coupled to a current drain 210 creating current signal iBiasN.

Figure 4:
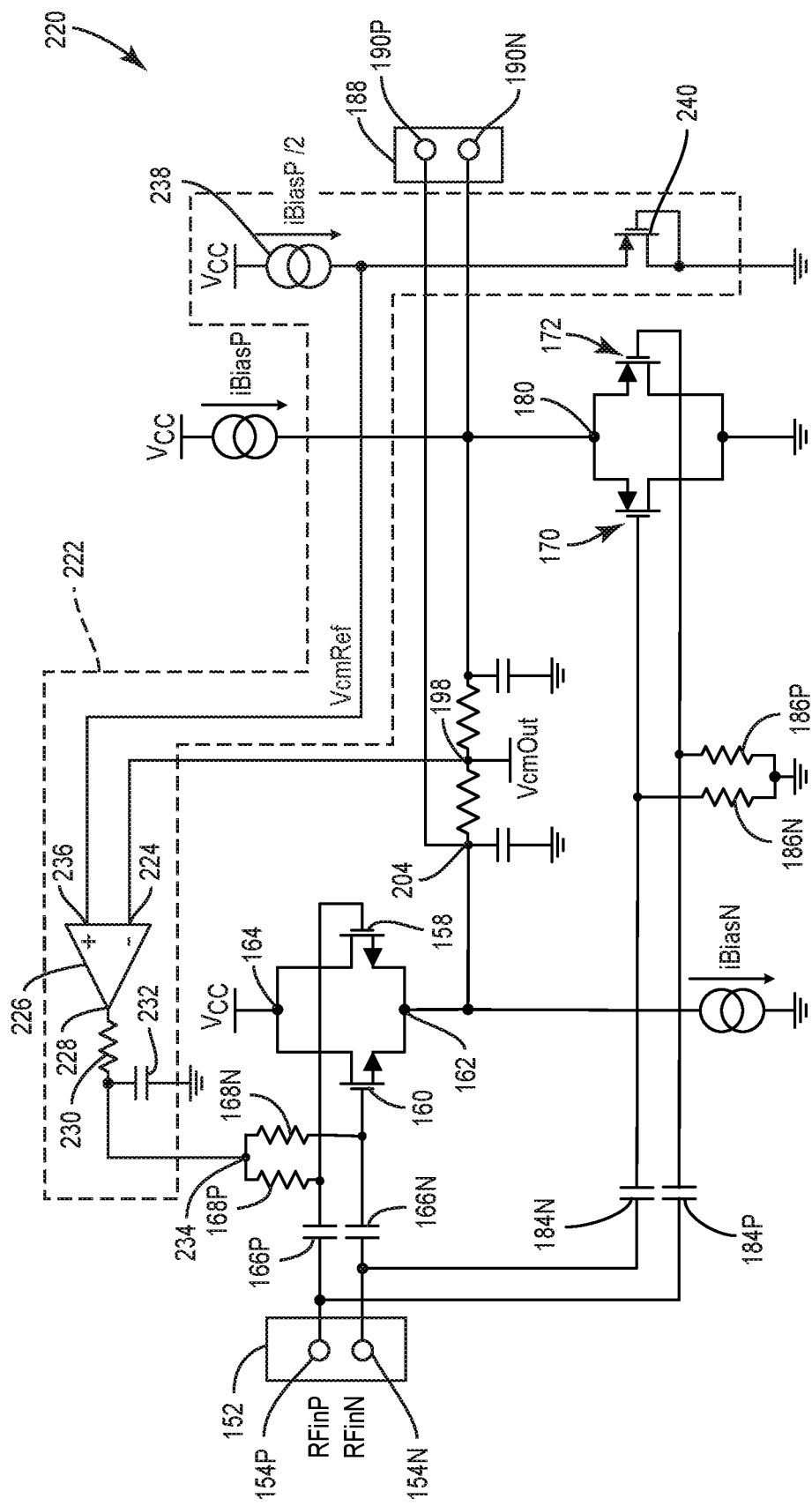
FIG. 4 is a circuit diagram of a second exemplary envelope detection circuit with a feedback circuit according to the present disclosure.

While the envelope detector circuit 150 is well-suited for use in a transmitter such as transmitter 10, variations also fall within the scope of the present disclosure. For example, as illustrated in FIG. 4, an envelope detector circuit 220 may include a feedback circuit 222 that couples the negative output line 190N to the input 152. Specifically, node 198 of the negative output line 190N is coupled to a negative input 224 of an operational amplifier (op-amp) 226. An output 228 of the op-amp 226 is coupled to a resistor 230 and a capacitor 232. A node 234 is coupled to the resistors 168P and 168N on the input lines 154P, 154N. A positive input 236 of the op-amp 226 is coupled to a second current source 238 and receives a current signal iBiasP/2. The current source 238 is also coupled to a transistor 240.

Figure 5:
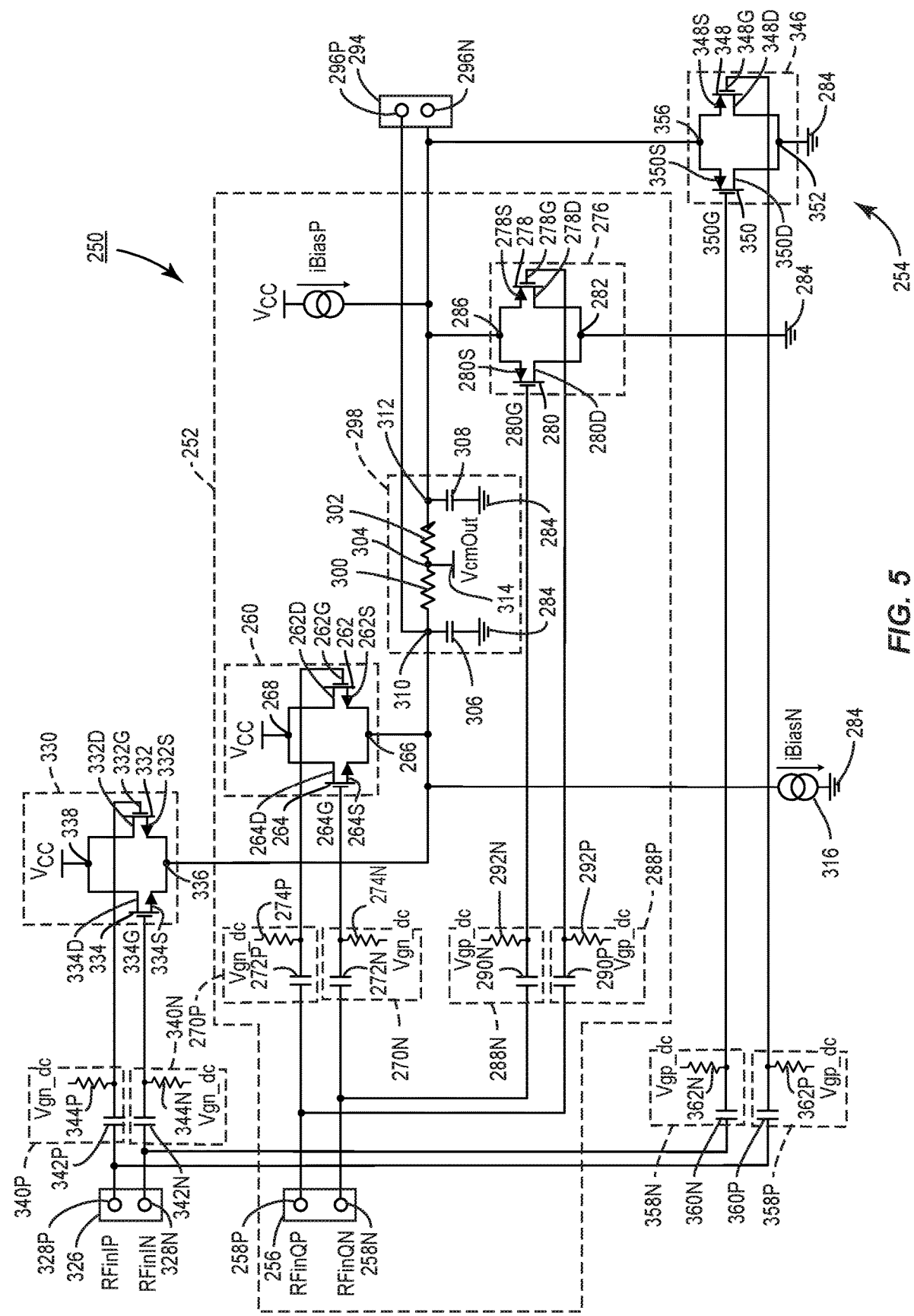
FIG. 5 is a circuit diagram of a third exemplary envelope detection circuit using a quadrature structure according to the present disclosure.

Another alternative is a quadrature structure as better illustrated by envelope detector circuit 250 in FIG. 5 that handles differential In-phase (I) and quadrature phase (Q) signals. The envelope detector circuit 250 includes, conceptually a first quadrature (Q) envelope detector 252 and a second in-phase (I) envelope detector 254 with some shared elements as further described herein. The first Q envelope detector 252 may be identical to the envelope detector circuit 150 but operating only on a differential Q signal. Likewise, the second I envelope detector 254 may be identical to the envelope detector circuit 150 but operating only on a differential I signal.

The first Q envelope detector 252 includes a first Q input 256 that receives a positive signal (e.g., RFinQP) at or on a positive input line 258P and receives a negative signal (e.g., RFinQN) at or on a negative input line 258N. The first Q envelope detector 252 may further include a first transistor pair 260 that includes a first transistor 262 coupled to the positive input line 258P and a second transistor 264 coupled to the negative input line 258N.

In this exemplary aspect, the first and second transistors 262, 264 may be FETs, and in particular are n-channel FETs (nFETs). The first transistor pair 260 may further include a first pair output 266 that couples to the sources 262S, 264S of the respective transistors 262, 264. The first transistor pair 260 also includes a supply voltage input 268 coupled to the drains 262D, 264D of the respective first and second transistors 262, 264. The supply voltage input 268 may receive a supply voltage signal $V_{CC}$.

The positive input inline 258P may be coupled to the gate 262G of the first transistor 262. Similarly, the negative input line 258N may be coupled to the gate 264G of the second transistor 264. The positive input line 154P may further include a positive filter 270P formed from positive line capacitor 272P and a positive line resistor 274P between the input 256 and the gate 262G. Similarly, the negative input line 258N may include a negative filter 270N having a negative line capacitor 272N and a negative line resistor 274N between the input 256 and the gate 264G.

The envelope detector 252 further includes a second transistor pair 276 that includes a third transistor 278 coupled to the positive input line 258P and a fourth transistor 280 coupled to the negative input line 258N. In this exemplary aspect, the third and fourth transistors 278, 280 may be FETs, and, in particular, are p-channel FETs (pFETs). The second transistor pair 276 may further include a second pair ground 282 that couples to the drains 278D, 280D of the respective transistors 278, 280 to a ground 284. The second transistor pair 276 may also include a second pair output 286 coupled to the sources 278S, 280S of the respective transistors 278, 280. The second pair output 286 may also receive a supply current signal iBiasP.

The positive input inline 258P may be coupled to the gate 278G of the third transistor 278. Similarly, the negative input line 258N may be coupled to the gate 280G of the fourth transistor 280. The positive input line 258P may further include a positive filter 288P formed from positive line capacitor 290P and a positive line resistor 292P between the input 256 and the gate 278G. Similarly, the negative input line 258N may include negative filter 288N having a negative line capacitor 290N and a negative line resistor 292N between the input 256 and the gate 280G.

The envelope detector circuit 250 may further include an output 294 that includes a positive output line 296P and a negative output line 296N. The positive output line 296P is coupled to the first pair output 266. The negative output line 296N is coupled to the second pair output 286. The negative output line 296N is also coupled to the first pair output 266 through a filter 298. The filter 298 includes at least one resistor and one capacitor and more specifically may include two resistors 300, 302 with a node 304 therebetween. Capacitors 306, 308 couple to ground 284 from nodes 310, 312 respectively. Node 304 may provide an output VcmOut 314.

It should be appreciated that the node 310 is essentially also the first pair output 266 and also coupled to the positive output line 296P. The negative output line 296N is also coupled to the supply current signal iBiasP at node 312. Likewise, the node 310 is coupled to a current drain 316 creating current signal iBiasN.

The second I envelope detector 254 has a nearly identical structure and reuses the filter 298. In particular, the second I envelope detector 254 includes a first I input 326 that receives a positive signal (e.g., RFinIP) at or on a positive input line 328P and receives a negative signal (e.g., RFinIN) at or on a negative input line 328N. The first I envelope detector 254 may further include a third transistor pair 330 that includes a fifth transistor 332 coupled to the positive input line 328P and a sixth transistor 334 coupled to the negative input line 328N.

In this exemplary aspect, the fifth and sixth transistors 332, 334 may be nFETs. The third transistor pair 330 may further include a third pair output 336 that couples to the sources 332S, 334S of the respective transistors 332, 334. The third transistor pair 330 also includes a supply voltage input 338 coupled to the drains 332D, 334D of the respective fifth and sixth transistors 332, 334. The supply voltage input 338 may receive the supply voltage signal $V_{CC}$.

The positive input inline 328P may be coupled to the gate 332G of the fifth transistor 332. Similarly, the negative input line 328N may be coupled to the gate 334G of the sixth transistor 334. The positive input line 328P may further include a positive filter 340P formed from positive line capacitor 342P and a positive line resistor 344P between the input 326 and the gate 332G. Similarly, the negative input line 328N may include a negative filter 340N having a negative line capacitor 342N and a negative line resistor 344N between the input 326 and the gate 334G.

The envelope detector 254 further includes a fourth transistor pair 346 that includes a seventh transistor 348 coupled to the positive input line 328P and an eighth transistor 350 coupled to the negative input line 328N. In this exemplary aspect, the seventh and eighth transistors 348, 350 may pFETs. The fourth transistor pair 346 may further include a second pair ground 352 that couples to the drains 348D, 350D of the respective transistors 348, 350 to the ground 284. The fourth transistor pair 346 may also include a second pair output 356 coupled to the sources 348S, 350S of the respective transistors 348, 350. The fourth pair output 346 may also receive a supply current signal iBiasP.

The positive input inline 328P may be coupled to the gate 348G of the seventh transistor 348. Similarly, the negative input line 328N may be coupled to the gate 350G of the eighth transistor 350. The positive input line 328P may further include a positive filter 358P formed from positive line capacitor 360P and a positive line resistor 362P between the input 326 and the gate 348G. Similarly, the negative input line 328N may include negative filter 358N having a negative line capacitor 360N and a negative line resistor 362N between the input 326 and the gate 350G.

The positive output line 296P is coupled to the third pair output 336. The negative output line 296N is coupled to the fourth pair output 356. The negative output line 296N is also coupled to the third pair output 336 through the filter 298.

Figure 6:
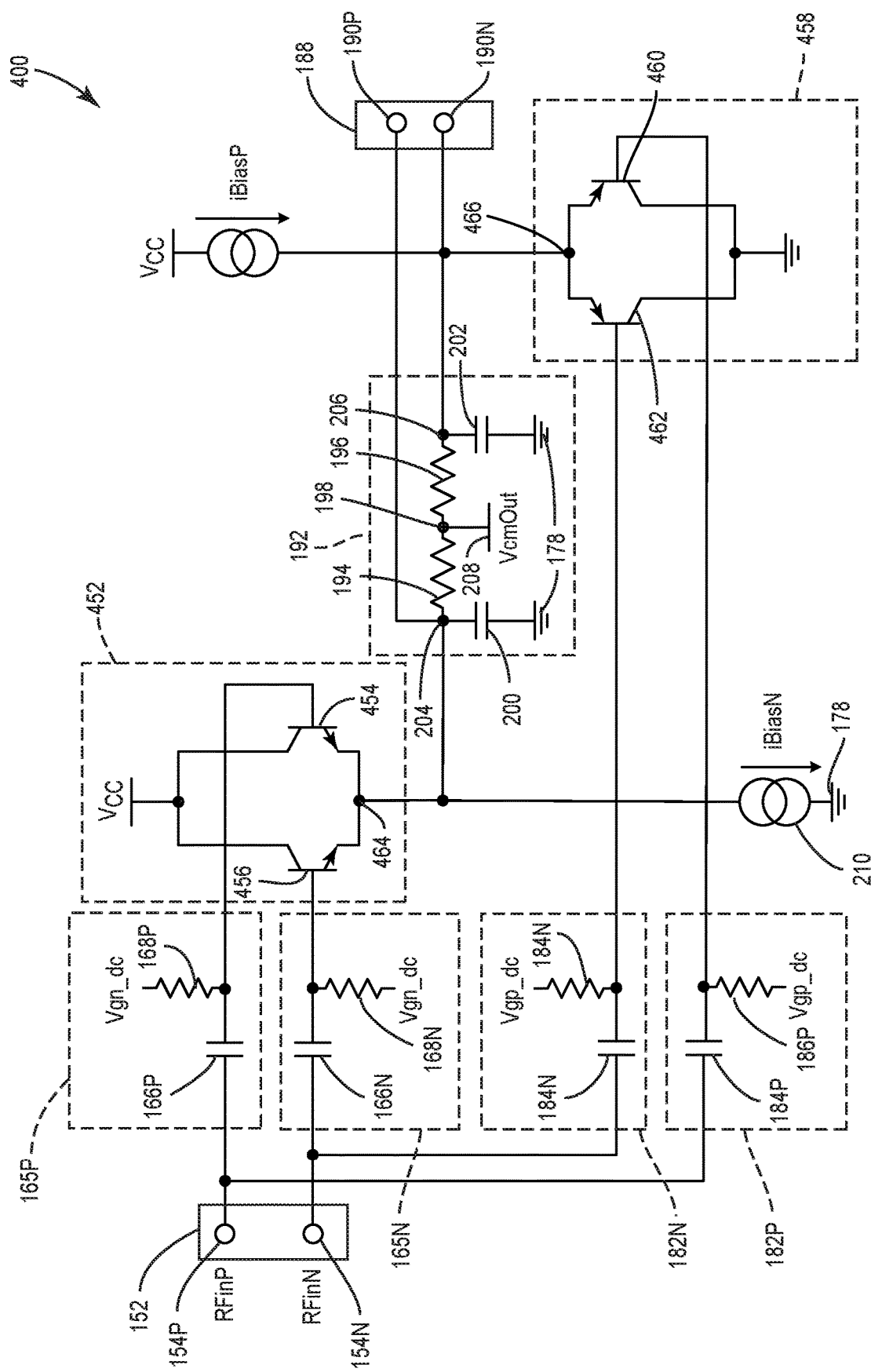
FIG. 6 is a circuit diagram of an envelope detection circuit similar to that of FIG. 3, but implemented with bipolar junction transistors (BJTs)

While FETs are used throughout FIGS. 3-5, the disclosure is not so limited and BJTs may be used in place of FETs. In this regard, FIG. 6 illustrates an envelope detector 400 that is substantially similar to the envelope detector 150 of FIG. 3, but the first transistor pair 156 is replaced by first transistor pair 452 having a first transistor 454 and a second transistor 456, where the transistors 454, 456 are npn BJTs. Likewise, the second transistor pair 170 is replaced by second transistor pair 458 having third transistor 460 and fourth transistor 462, where the transistors 460, 462 are pnp BJTs. It should be appreciated that each BJT has a collector, base, and emitter. The positive input line 154P couples to the base of the first and third transistors 454, 460 and the negative input line 154N couples to the base of the second and fourth transistors 456, 462. The positive output line 190P couples to a first pair output 464 and the negative output line 190N couples to the first pair output 464 and a second pair output 466. The first pair output 464 is a node joining the emitters of the first and second transistors 454, 456 while the second pair output 466 is a node joining the emitters of the third and fourth transistors 460, 462.

Figure 7:
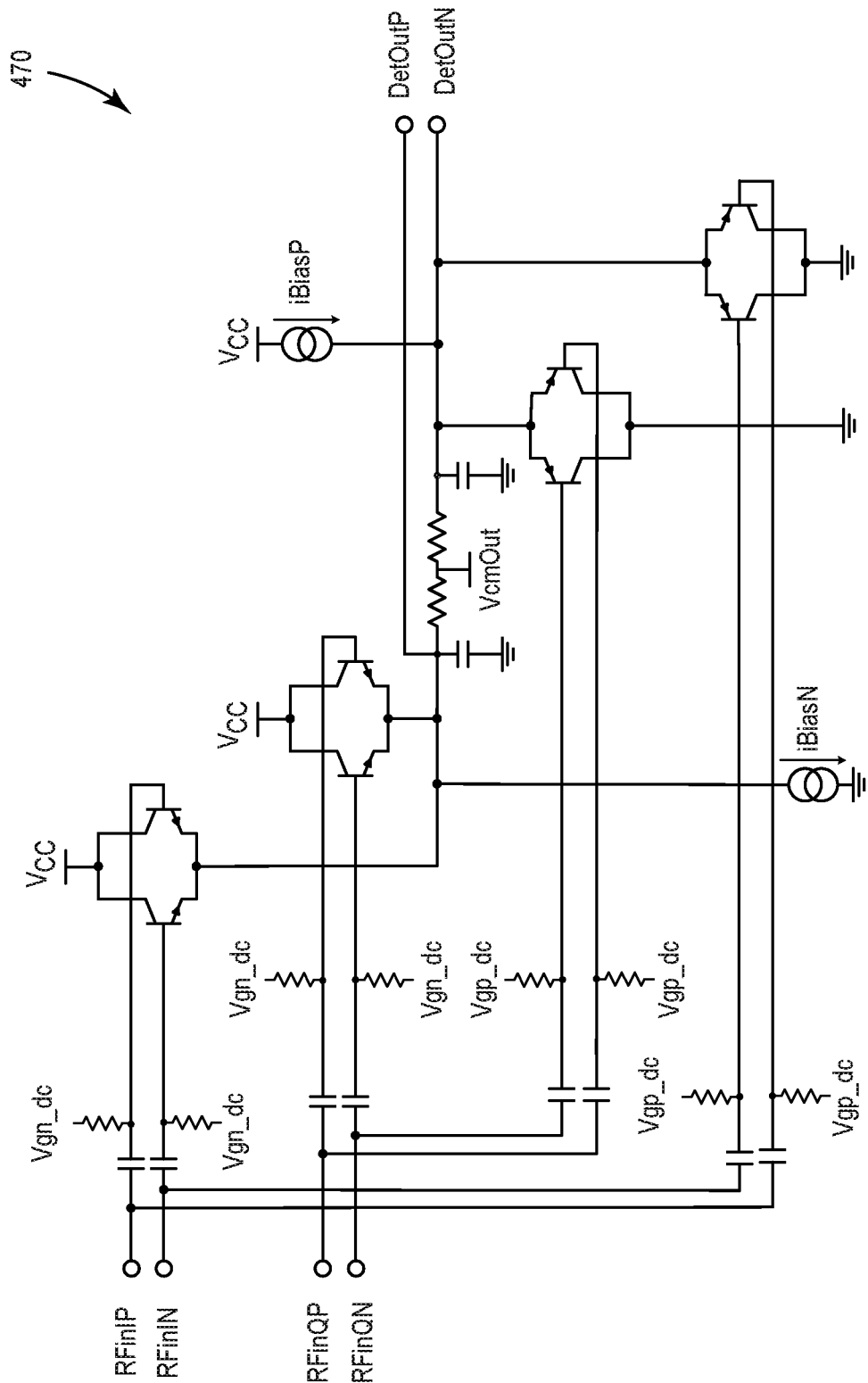
FIG. 7 is a circuit diagram of an envelope detection circuit similar to that of FIG. 5, but implemented with BJTs.

FIG. 7 illustrates a quadrature envelope detector 470, substantially similar to the quadrature envelope detector 250 of FIG. 5, but with the FETs replaced by BJTs. Because the structures are nearly identical, further discussion is omitted.

Those skilled in the art will recognize improvements and modifications to the preferred embodiments of the present disclosure. All such improvements and modifications are considered within the scope of the concepts disclosed herein and the claims that follow.

What is claimed is:

1. An envelope detector circuit comprising:
   an input comprising a positive input line and a negative input line;
   a first transistor pair comprising:
      a first transistor coupled to the positive input line;
      a second transistor coupled to the negative input line; and
      a first pair output;
   a second transistor pair comprising:
      a third transistor coupled to the positive input line;
      a fourth transistor coupled to the negative input line; and
      a second pair output;
   an output comprising:
      a positive output line coupled to the first pair output; and
      a negative output line coupled to the first pair output and the second pair output; and
   a filter comprising at least one resistor and one capacitor, the filter positioned within the negative output line between the first pair output and the second pair output.

2. The envelope detector circuit of claim 1, wherein the transistors comprise field effect transistors (FETs).

3. The envelope detector circuit of claim 2, wherein the first transistor and the second transistor comprise negative channel FETs (nFETs), each comprising a respective source, drain, and gate.

4. The envelope detector circuit of claim 3, wherein the first pair output couples to the source of the first transistor and the source of the second transistor.

5. The envelope detector circuit of claim 3, wherein the positive input line couples to the gate of the first transistor; and
   the negative input line couples to the gate of the second transistor.

6. The envelope detector circuit of claim 3, wherein the third transistor and the fourth transistor comprise positive channel FETs (pFETs), each comprising a respective source, drain, and gate.

7. The envelope detector circuit of claim 6, wherein the positive input line couples to the gate of the third transistor; and
   the negative input line couples to the gate of the fourth transistor.

8. The envelope detector circuit of claim 2 further comprising a feedback circuit coupling the negative output line to the input.

9. The envelope detector circuit of claim 3, further comprising a supply voltage input coupled to the drains of the first and second FETs.

10. The envelope detector circuit of claim 1, further comprising:
  a second input;
  a third transistor pair coupled to the first pair output and the second input; and
  a fourth transistor pair coupled to the second pair output and the second input.

11. The envelope detector of claim 1, wherein the transistors comprise bipolar junction transistors (BJTs).

12. The envelope detector of claim 11, wherein the first and second transistors comprise npn BJTs and the third and fourth transistors comprise pnp BJTs, each transistor having a respective collector, base, and emitter.

13. The envelope detector of claim 12, wherein the positive input line couples to the base of the first and third transistors and the negative input line couples to the base of the second and fourth transistors.

14. The envelope detector of claim 12, wherein the positive output line couples to the first pair output and wherein the negative output line couples to the first pair output and the second pair output.

15. The envelope detector of claim 12, wherein the first pair output comprises a node joining the emitters of the first and second transistors and the second pair output comprises a second node joining the emitters of the third and fourth transistors.

16. A wireless device comprising:
  an envelope detector circuit comprising:
    an input comprising a positive input line and a negative input line;
    a first transistor pair comprising:
      a first transistor coupled to the positive input line;
      a second transistor coupled to the negative input line; and
      a first pair output;
    a second transistor pair comprising:
      a third transistor coupled to the positive input line;
      a fourth transistor coupled to the negative input line; and
      a second pair output;
    an output comprising:
      a positive output line coupled to the first pair output; and
      a negative output line coupled to the first pair output and the second pair output; and
    a filter comprising at least one resistor and one capacitor, the filter positioned within the negative output line between the first pair output and the second pair output; and
  an envelope tracking (ET) radio frequency (RF) front-end circuits comprising:
    an ET integrated circuit (ETIC) coupled to the output, the ETIC configured to generate at least one control voltage based on a signal from the envelope detector circuit; and
    a plurality of power amplifiers coupled to a plurality of antenna ports, respectively, at least one of the plurality of power amplifiers coupled to the ETIC and configured to receive the at least one control voltage.

17. The wireless device of claim 16, wherein the transistors comprise field effect transistors (FETs).

18. The wireless device of claim 16, wherein the transistors comprise bipolar junction transistors (BJTs).

19. The wireless device of claim 16, further comprising a baseband circuit and an intermediate frequency (IF) circuit, wherein the envelope detector circuit is configured to detect an IF signal in the IF circuit.

* * * * *